US00RE42349E

(19) United States
(12) Reissued Patent
Lin et al.

(10) Patent Number: US RE42,349 E
(45) Date of Reissued Patent: May 10, 2011

(54) WAFER TREATING METHOD FOR MAKING ADHESIVE DIES

(75) Inventors: Chun-Hung Lin, Tainan (TW); Jesse Huang, Kaohsiung (TW); Kuang-Hui Chen, Kaohsiung (TW); Shih-Wen Chou, Tainan (TW)

(73) Assignees: ChipMOS Technologies (Bermuda), Hamilton (BM); ChipMOS Technologies Inc., Hsinchu (TW)

(21) Appl. No.: 11/371,307

(22) Filed: Mar. 7, 2006

Related U.S. Patent Documents

Reissue of:
(64) Patent No.: 6,703,075
Issued: Mar. 9, 2004
Appl. No.: 10/327,064
Filed: Dec. 24, 2002

(51) Int. Cl.
*B05D 5/10* (2006.01)
*B05D 3/12* (2006.01)
*H01L 21/00* (2006.01)

(52) U.S. Cl. ..... 427/207.1; 427/289; 427/285; 438/112; 438/118; 438/126; 438/127

(58) Field of Classification Search ..... 427/207.1, 427/289, 385.5; 438/118, 112, 126, 127; 156/327
See application file for complete search history.

(56) References Cited

U.S. PATENT DOCUMENTS

| | | | | |
|---|---|---|---|---|
| 5,635,010 | A * | 6/1997 | Pepe et al. | 156/264 |
| 6,689,638 | B2 * | 2/2004 | Lin et al. | 438/118 |
| 6,943,061 | B1 * | 9/2005 | Sirinorakul et al. | 438/113 |
| 2001/0005935 | A1 * | 7/2001 | Tandy | 29/836 |

FOREIGN PATENT DOCUMENTS

| | | |
|---|---|---|
| JP | 58-196031 | 11/1983 |
| JP | 6-302629 | 10/1994 |
| TW | 457654 | 10/2001 |

* cited by examiner

*Primary Examiner* — Timothy H Meeks
*Assistant Examiner* — Cachet I Sellman
(74) *Attorney, Agent, or Firm* — J.C. Patents

(57) ABSTRACT

A wafer treating method for making adhesive dies is provided. A liquid adhesive with two-stage property is coated on a surface of a wafer. Then, the wafer is pre-cured to make the liquid adhesive transform a thermo-bonding adhesive film having B-stage property which has a glass transition temperature not less than 40° C. for handling without adhesive under room temperature. After positioning the wafer, the wafer is singulated to form a plurality of dies with adhesive for die-to-die stacking, die-to-substrate or die-to-leadframe attaching.

14 Claims, 7 Drawing Sheets

WAFER TREATING METHOD FOR MAKING ADHESIVE DIES

Matter enclosed in heavy brackets [ ] appears in the original patent but forms no part of this reissue specification; matter printed in italics indicates the additions made by reissue.

FIELD OF THE INVENTION

The present invention is generally relating to a wafer treating technique after finishing integrated circuits on a wafer, particularly to a wafer treating method for making adhesive dies.

BACKGROUND OF THE INVENTION

After manufacturing the integrated circuits on a semiconductor wafer, a plurality of dies are singulated from the semiconductor wafer and according to various packaging styles are attached on a proper IC substrate, or one of dies is attached one on top of the other die to form multi-chip stack. Die is attached onto a printed circuit board to form Ball Grid Array (BGA) package. Die is attached to die pad or inner leads of a lead frame to form Thin Small Outline Package (TSOP). Conventional adhesive for die-attaching is thermosetting silver liquid compound or solid polyimide adhesive tape, which is applied on base carrier (e.g., substrate, leadframe or lower die) during die-attaching.

A method for assembling multi-chip module disclosed from U.S. Pat. No. 2001/0005935 is to attach a larger die onto a substrate using a die attach machine, then a smaller die is affixed on the larger die without using a die attach machine. The adhesive attaching the larger die and the smaller die conventionally is a liquid thermosetting adhesive or solid polyimide tape. However, that is failed to disclose the procedure of coating the adhesive (firstly coated on the smaller die or on the larger die prior to die-attaching and the procedure of wire-bonding. On one hand, when a liquid thermosetting adhesive is used for die-attaching prior wire-bonding, it is difficult to pre-coat on the smaller die (upper die) and also easy to contaminate the bonding pads of the larger die (lower die) due to flowage of liquid thermosetting adhesive. On the other hand, when the liquid adhesive is printed after wire-bonding, the printing screen is unable to be placed on the larger die(or substrate) with bonding wires, so that adhesive must be applied on the larger die before wire-bonding. Thus, the limits for multi-chip packaging process are quite a lots, lead to package uneasily. Alternatively, a solid adhesive tape may also be used for die-attaching, but cost of adhesive tape is high and the adhesive tape is demanded double-sided adhesive for die-to-die, die-to-substrate or die-to-leadframe bonding. Conventionally the adhesive tape is firstly attached on a substrate (leadframe or larger die) in predetermined pattern, then a die is bonded on the adhesive tape. The dies do not have adhesive after sigulating from a wafer.

SUMMARY

A first object of the present invention is to provide a wafer treating method for making adhesive dies by utilizing a liquid adhesive with two-stage property printed on a wafer. The printed adhesive with two-stage property is pre-cured to become solid without flowable and adhesive under room temperature (B-stage condition), then after singulating the wafer, a plurality of dies with B-stage adhesive will be obtained for decreasing cost of forming adhesive.

A second object of the present invention is to provide a wafer treating method for making adhesive dies by utilizing a liquid adhesive with two-stage property printed on a wafer. The adhesive with two-stage property is precured to become solid film without flowable and adhesive under room temperature (B-stage condition), then after singulating the wafer, the dies with B-stage adhesive will be obtained, so as to possess good processing characteristic for a variety of semiconductor packaging processes.

In accordance with the wafer treating method for making adhesive dies of the present invention, a semiconductor wafer having integrated circuits is provided. The wafer has a plane surface, such as an active surface or an inactive surface. A liquid adhesive with two-stage property is evenly coated on the partial or overall surface of the wafer by means of screen printing, stencil printing or spin coating. It is desirable to coat the liquid adhesive with two-stage property on the partial surface of the wafer without covering the cutting paths or bonding pads of the wafer. Next, the wafer is pre-cured to make the adhesive with two-stage property become a wafer-level thermo-bonding adhesive film with B-stage property, that is, being solid without flowable and adhesive under room temperature. Usually the pre-cured time is about 1 hour around 125° C. Meanwhile, the B-stage solid film has thermosetting property and adhesion of thermal bonding, also has a glass transition temperature (Tg) more than 40° C. for operation of positioning the wafer, sucking the dies utilizing a die binder and transportation after singulating the dies from the wafer. Thus the dies with wafer-level thermo-bonding adhesive film are provided to affix to a substrate, another die, a printed circuit board, a ceramic circuit board or a lead frame without extra adhesive. Therefore, the dies with wafer-level thermo-bonding adhesive film are able to be efficiently, broadly used in die-to-die stack or die-to-substrate attach for various packages at low cost.

*Additionally, the present invention is directed to a chip package comprising a carrier, a first chip, a first adhesive layer and a molding compound. The first chip is disposed on the carrier and electrically connected with the carrier. The first adhesive layer is disposed between the carrier and the first chip, wherein an area of the first adhesive layer is not larger than an area of the first chip. The molding compound is disposed on the carrier to cover the first chip.*

*In accordance with the chip package of the present invention, the chip package further comprises a plurality of first bonding wires, which are electrically connected with the carrier and the first chip. The first adhesive layer can be an adhesive film, wherein the adhesive film can be an adhesive film having B-stage property.*

*In accordance with the chip package of the present invention, wherein the carrier is a package substrate or a lead frame.*

*In accordance with the chip package of the present invention, the chip package further comprises a second adhesive layer and a second chip, wherein the second adhesive layer is disposed on the first chip and the second chip is disposed on the second adhesive layer. And wherein an area of the second adhesive layer is not larger than an area of the second chip and the second chip is electrically connected with the carrier.*

*In accordance with the chip package of the present invention, the chip package further comprises a plurality of second bonding wires, which are electrically connected with the carrier and the second chip.*

*In accordance with the chip package of the present invention, wherein the second bonding wires and the second chip*

*are covered with the molding compound. In accordance with the chip package of the present invention, wherein the second adhesive layer is disposed between an inactive surface of the second chip and an active surface of the first chip.*

*In accordance with the chip package of the present invention, wherein the second adhesive layer can be an adhesive film.*

*In accordance with the chip package of the present invention, wherein the second adhesive layer can be an adhesive film having B-stage property.*

*In addition, the present invention is directed to a chip package comprising a carrier, a first chip, a second chip, a second adhesive layer and a molding compound. The first chip is disposed on the carrier and electrically connected with the carrier. The second chip is disposed on the first chip and electrically connected with the carrier. The second adhesive layer is disposed between the first chip and the second chip, wherein an area of the second adhesive layer is not larger than an area of the second chip. The molding compound is disposed on the carrier to cover the first chip, the second chip, and the second adhesive layer.*

*In accordance with the chip package of the present invention, the chip package further comprises a plurality of first bonding wires, which are electrically connected with the carrier and the first chip.*

*In accordance with the chip package of the present invention, the chip package further comprises a plurality of second bonding wires, which are electrically connected with the carrier and the second chip.*

*In accordance with the chip package of the present invention, wherein the second adhesive layer can be an adhesive film.*

*In accordance with the chip package of the present invention, wherein the second adhesive layer can be an adhesive film having B-stage property.*

*In accordance with the chip package of the present invention, the chip package further comprises a first adhesive layer, which is disposed between the carrier and the first chip. In addition, the first adhesive layer can be an adhesive film.*

*In accordance with the chip package of the present invention, wherein the first adhesive layer can be an adhesive film having B-stage property.*

*In accordance with the chip package of the present invention, wherein the carrier is a package substrate or a lead frame.*

*In accordance with the chip package of the present invention, wherein the second adhesive layer is disposed between an inactive surface of the second chip and an active surface of the first chip.*

DETAILED DESCRIPTION OF THE PRESENT INVENTION

Figure 1:
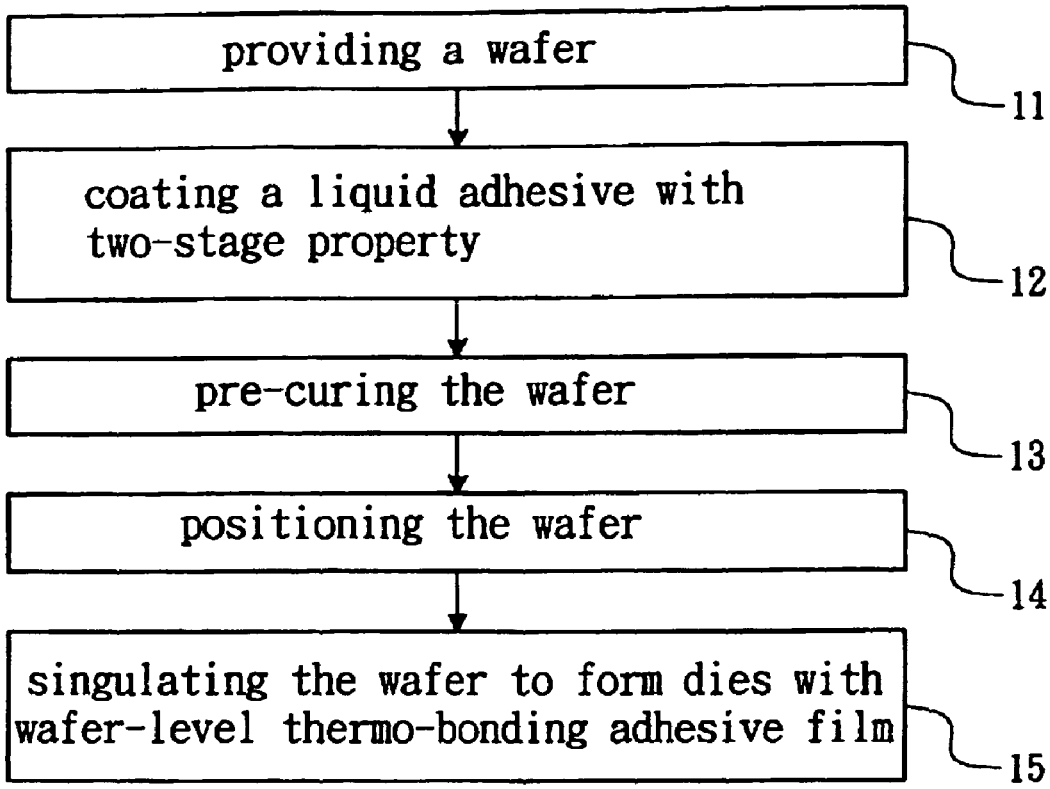
FIG. 1 is a flow chart of a wafer treating method for making adhesive dies in accordance with the present invention.

Referring to the drawings attached, the present invention will be described by means of the embodiments below.

As shown in FIG. 1, the wafer treating method for making adhesive dies according to the present invention comprises the main steps of "providing a wafer" 11, "coating a liquid adhesive with two-stage property" 12, "pre-curing the wafer" 13, "positioning the wafer" 14 and "singulating the wafer to form dies with wafer-level thermo-bonding adhesive film" 15.

Figure 2:
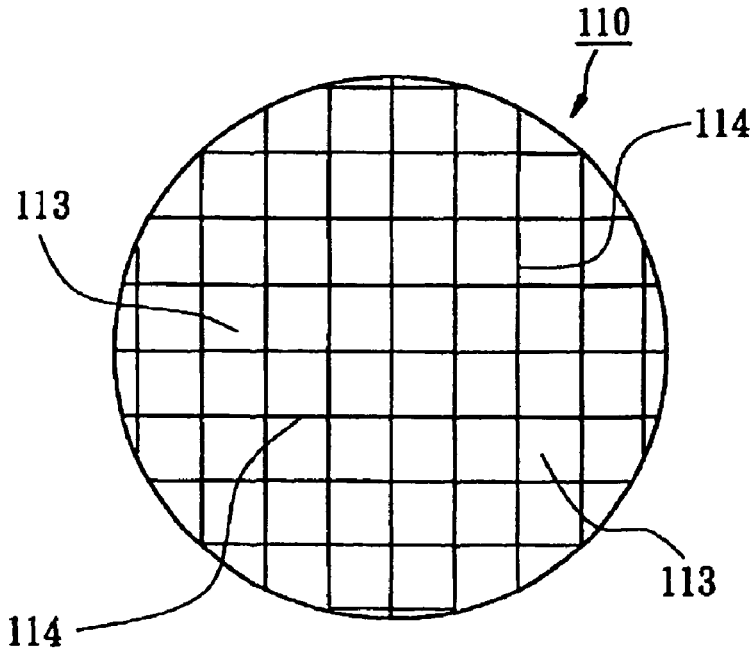
FIG. 2 is a front view of a provided wafer in accordance with a wafer treating method for making adhesive dies of the present invention.
Figure 3A:
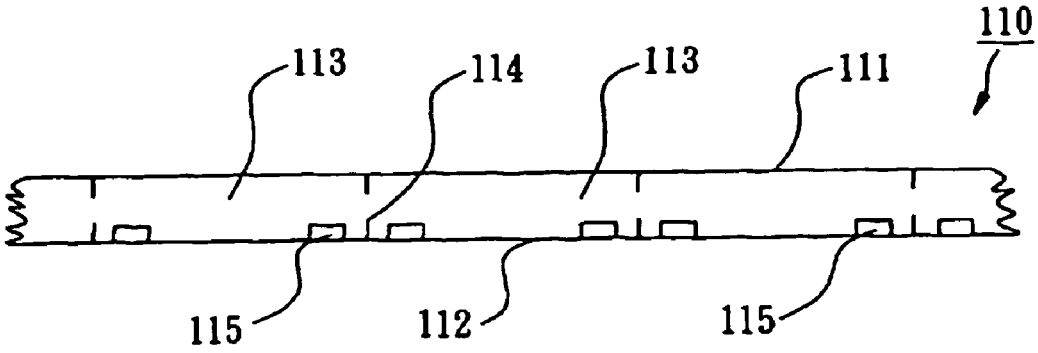
FIG. 3A to FIG. 3D are cross-sectional views of a wafer in wafer treating process in accordance with a first embodiment of the present invention.
Figure 3B:
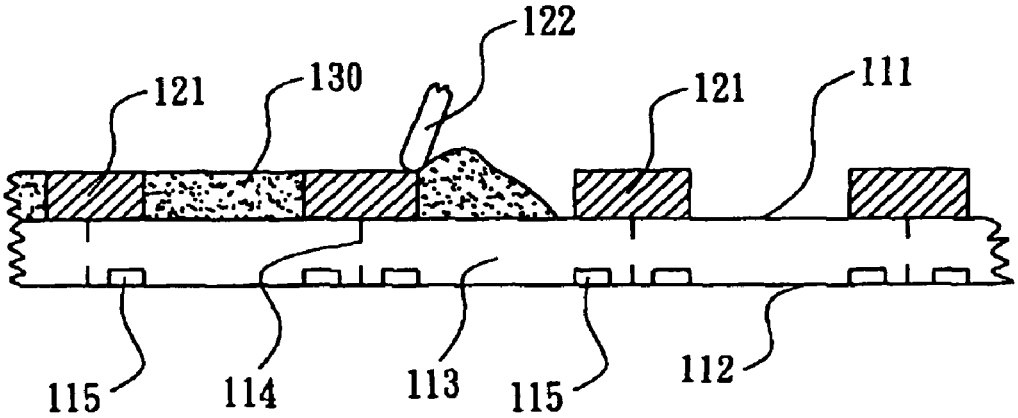

As illustrated in FIG. 2 and FIG. 3A, initially in the step of "providing a wafer" 11, a wafer 110 is provided. The wafer 110 has an active surface 112 which had formed integrated circuits and bonding pads 115, an inactive surface 111 corresponding to the active surface 112 in order to integrate a plurality of dies 113 together. The bonding pads 115 are located on each die 113. There are straight cutting paths 114 located at the perimeters of the dies 113 to define the dies 113. According to predetermined packag or stack process, a surface of the wafer 110 for required to being adhesive is active surface 112 or inactive surface 111. In the first embodiment, the inactive surface 111 of the wafer 110 is predetermined to be adhesive, the inactive surface 111 should face upward. Next, the step of "coating a liquid adhesive with two-stage property" 12 is executed, as shown in FIG. 3B. A liquid adhesive 130 having at least two-stage property (A-stage, B-stage, C-stage) is coated on partially or totally inactive surface 111 of the wafer 110 by screen printing, stencil printing or spin coating. Preferably, a screen 121 is placed on the inactive surface 111 of the wafer 110, then the liquid adhesive 130 with proper flowability is printed on the inactive surface 111 by a scraper 122. In this embodiment, the screen 121 covers the cutting paths 114 of the wafer 110 so that the adhesive 130 with two-stage property is partially printed on the inactive surface 111 of the wafer 110 without covering the cutting paths 114. Since the dies 113 formed in this embodiment are used for die-to-die stack, the printed thickness of the adhesive 130 with two-stage property is about 3~6 mil and depends on the screen 121. The adhesive 130 with two-stage property includes thermosetting resin or polymer such as polyimide, polyquinolin or benzocyclobutene and solvent that enable dissolution of mentioned-above thermosetting resin such as mix-solvent of butyrolactone and cyclopentanone or 1,3,5-mesitylene, etc. Since the liquid adhesive 130 with two-stage property has A-stage property while coated, the liquid adhesive 130 is fluid enough to be printed.

Figure 3C:
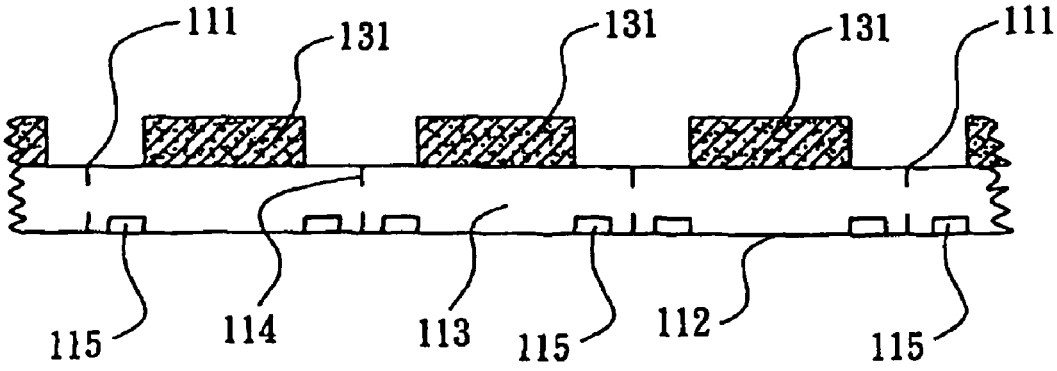

Next, the step of "pre-curing the wafer" 13 is executed as shown in FIG. 3C. The wafer 130 is placed in an oven to be heated at a proper temperature (90~150° C. approximately) for 1 hour for removing solvent. The pre-curing procedure is to remove the solvent of the liquid adhesive 130 with two-stage property, so that the printed liquid adhesive 130 transforms a wafer-level thermo-bonding adhesive film 131. Otherwise, the pre-curing step 13 is executed by vacuum drying.

The wafer-level thermo-bonding adhesive film 131 is solid and has a thickness between 3~8 mil for die-to-die stacking, preferably between 5~6 mil. And the wafer-level thermo-bonding adhesive film 131 becomes adhesive when operating temperature is more than its glass transition temperature (Tg), that is to say, the wafer-level thermo-bonding adhesive film 131 possesses B-stage condition and also has thermosetting property. Preferably, the glass transition temperature of the wafer-level thermo-bonding adhesive film 131 is not less than 40° C. (Tg≧40° C.). Therefore, the wafer 110 with the wafer-level thermo-bonding adhesive film 131 is easy to handle, transport under normal room temperature.

Figure 3D:
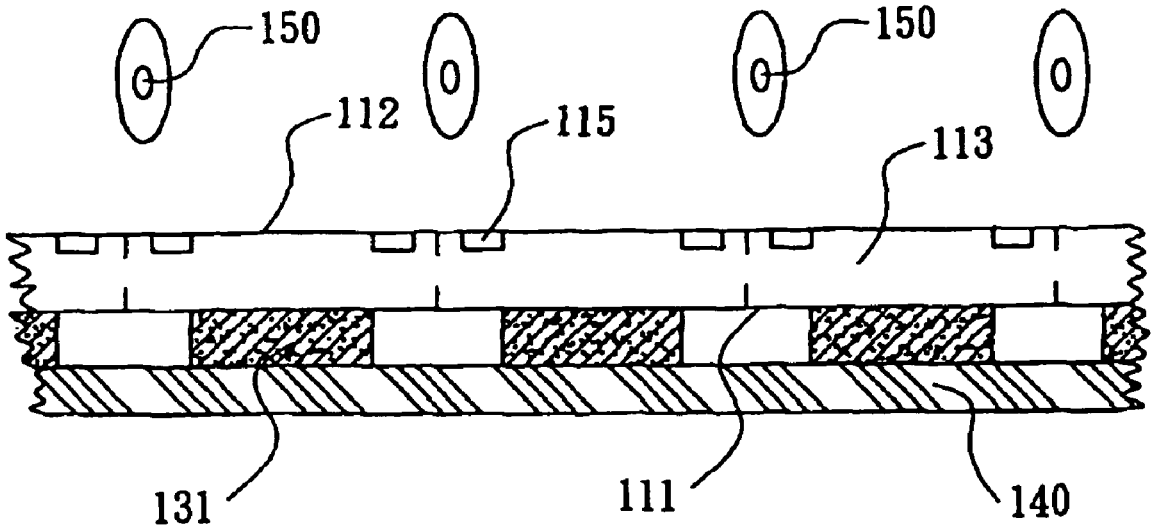
Figure 3E:
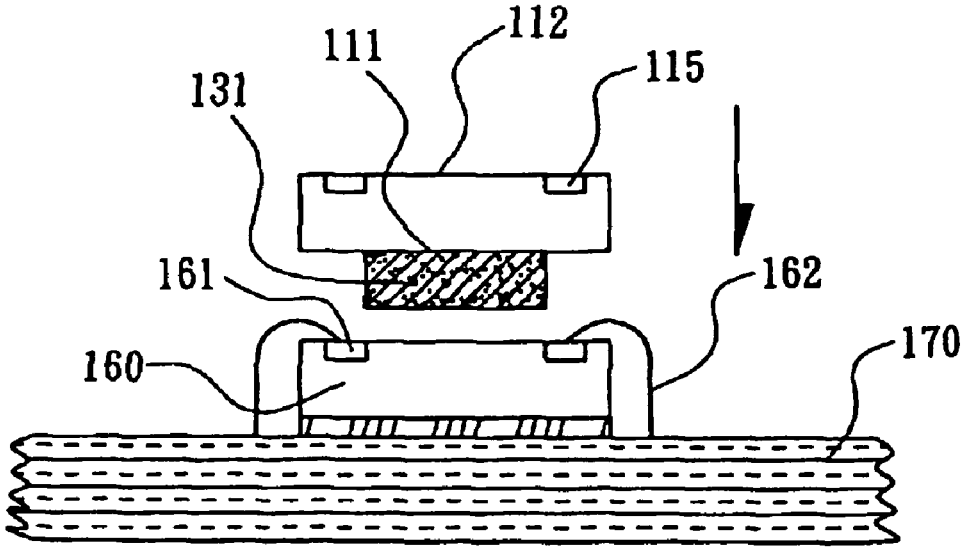
FIG. 3E to FIG. 3F are cross-sectional views of an adhesive die made from the first embodiment in die-to-die stack.
Figure 3F:
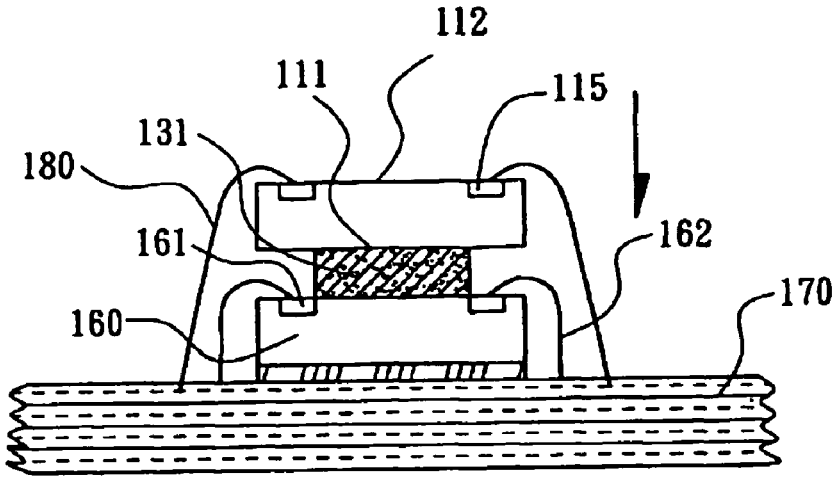

Next, the step of "positioning the wafer" 14 is executed as shown in FIG. 3D, the wafer 110 is turned over to make the inactive surface 111 facing downward and attached to a positioning tape 140. The positioned tape 140 is a wafer positioning tape such as polyvinyl chloride, which has adhesive and is attached to a metal frame with circular opening for wafer-dicing procedure. In the first embodiment, the wafer-level thermo-bonding adhesive film 131 attaches on the positioning tape 140 by the adhesive of the positioning tape 140. After completing the step of "positioning the wafer" 14, the step of "singulating the wafer to form dies with wafer-level thermo-bonding adhesive film" 15 is executed that is along the cutting paths 114 to dice the wafer 110 by using the dicer 150 (laser or diamond cutting tool) of wafer-dicing machine to form a plurality of dies 113 with wafer-level thermo-bonding adhesive film 131. Thus, the adhesive dies 113 not only can be rapidly provided at low cost but also can be used in die-to-die stacks or other various packages. For example, as shown in FIG. 3E, initially another die 160 is affixed to a substrate 170 and the bonding pads 161 of the die 160 is electrically connected with the substrate 170 by bonding wires 162, then the die 113 with the wafer-level thermo-bonding adhesive film 131 is sucked by a die attach machine and is affixed onto the die 160. A die-to-die stack structure will be completed in few seconds, even in less than a second when a thermal compression temperature 120° C.-175° C. approximately is supplied at the die 113 to allow the wafer-level thermo-bonding adhesive film 131 become adhesive (as shown in FIG. 3F). However, it is desirable that the thermal compression temperature and time do not make the wafer-level thermo-bonding adhesive film 131 finish the thermosetting reaction after die-to-die attaching. Thereafter, the bonding wires 180 are wire-bonded to electrically connect the bonding pads 115 of the die 113 with the substrate 170. However, the wafer treating method for making adhesive dies of the present invention is applicable not only for die-to-die stacking but also for the-to-substrate and die-to-leadframe attaching for various packages. Alternatively, in the step of "coating the liquid adhesive with two-stage property" 12, a layer of liquid adhesive 130 with two-stage property is completely coated on all of the inactive surface 111 of a wafer 110 by spin coating or printing method, then passing through pre-curing step 13, positioning step 14 and singulating step 15, a plurality of dies 113 with wafer-level thermo-bonding adhesive film 131 on the inactive surface thereof are formed for die-to-substrate attaching. The wafer-level thermo-bonding adhesive film 131 has higher viscous and handling-easier than conventional silver liquid paste so that the contact pads of substrate can be closer to the adhesive die 113 for making chip scale package (CSP).

Figure 4A:
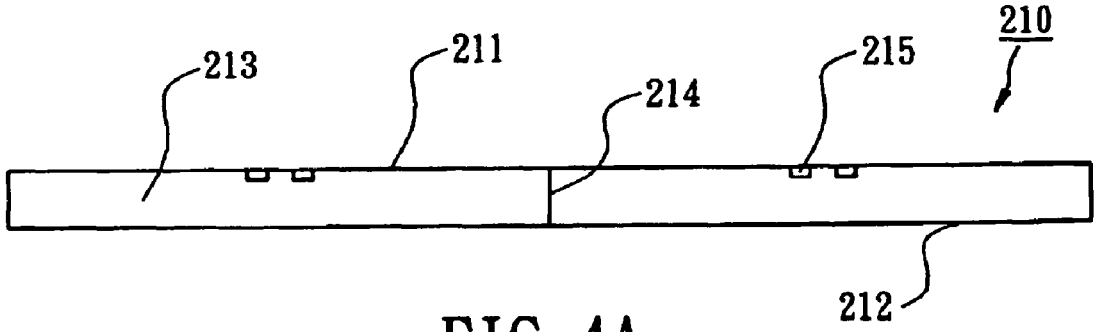
FIG. 4A to FIG. 4D are cross-sectional views of a wafer in wafer treating process in accordance with a second embodiment of the present invention.
Figure 4B:
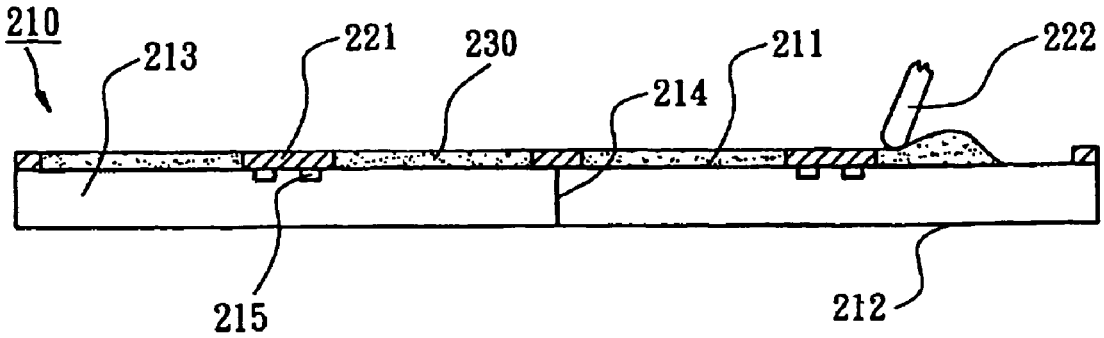

In order to understand the present invention is not limited to the printing surface of wafer, the second embodiment is presented. As shown in FIG. 4A, initially a wafer 210 is provided. The wafer 210 has an active surface 211 having a plurality of bonding pads 215 (or bumps) and an inactive surface 212 corresponding to the active surface 211 to integrate a plurality of dies 213. The bonding pads 215 are located at the center of each die 213 and the active surface 211 faces upward. Thereafter, as shown in FIG. 4B, a liquid adhesive 230 with two-stage property is formed on the active surface 211 by screen printing or stencil printing method. A screen 221 is put on the active surface 211 of the wafer 210, then the liquid adhesive 230 with two-stage property is printed on the active surface 212 by a scraper 222. In the second embodiment, since the screen 221 covers the bonding pads 215 of the wafer 210, the liquid adhesive 230 with two-stage property is partially printed on the active surface 212 of the wafer 210 with predetermined pattern, the thickness thereof is about 1~3 mil.

Figure 4C:
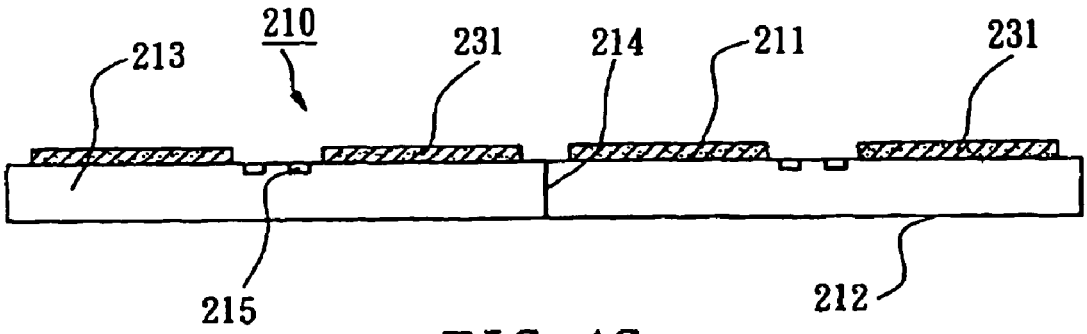
Figure 4D:
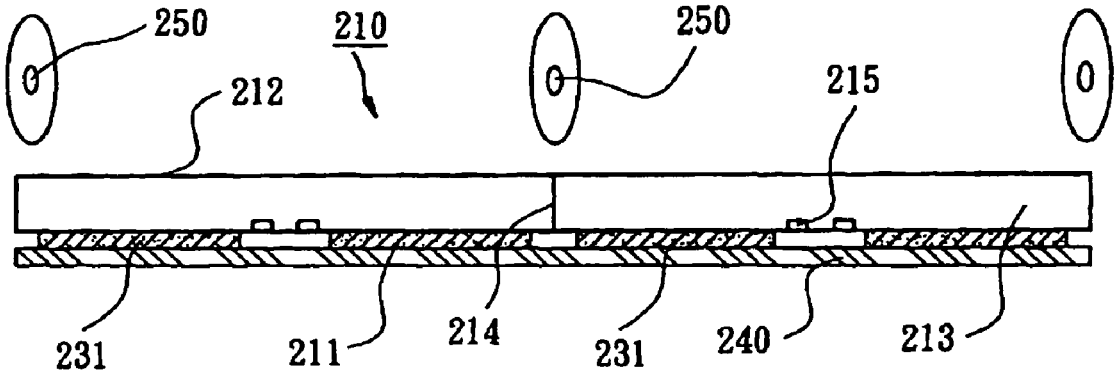
Figure 4E:
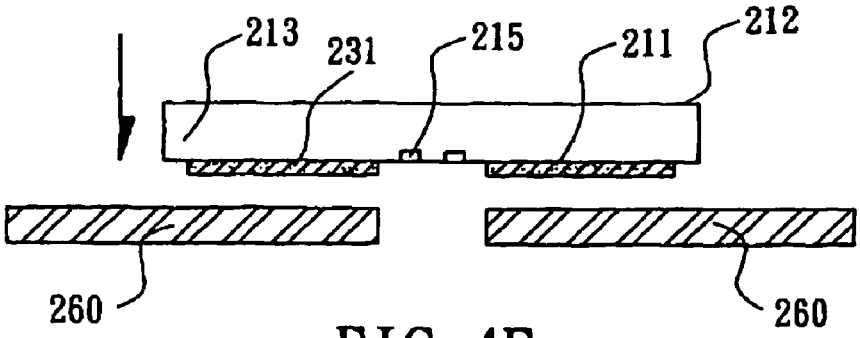
FIG. 4E to FIG. 4F are cross-sectional views of an adhesive die made from the second embodiment in die-to-substrate package.
Figure 4F:
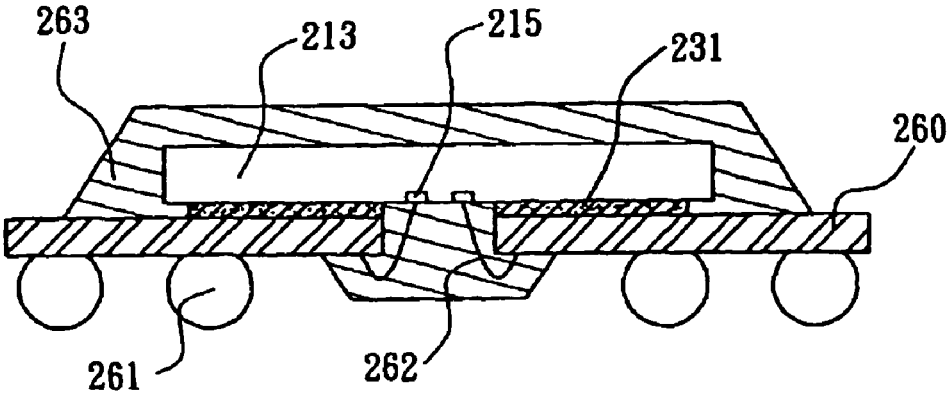

Then, as shown in FIG. 4C, the wafer 210 is pre-cured to remove solvent in the liquid adhesive 230 with two-stage property on the active surface 211 of the wafer 210 so as to transform a wafer-level thermo-bonding adhesive film 231. The wafer-level thermo-bonding adhesive film 231 has B-stage property and has a glass transition temperature (Tg) not less than 40° C., so that the wafer-level thermo-bonding adhesive film 231 doesn't possess adhesive under the normal room temperature for being portable, movable and storable and also possesses thermo-bonding adhesive. Next, as shown in FIG. 4D, the wafer 210 is turned over so that the active surface 211 faces downward and is positioned onto a positioning tape 240. After the wafer 210 is positioned, it is diced along the cutting paths 214 by a dicer 250 to form a plurality of dies 213 with wafer-level thermo-bonding adhesive film 231 on the active surface 211. Thus, the adhesive dies 213 not only can be rapidly provided at low cost but also can be utilized in various packages. For example, as shown in FIG. 4E, the die 213 with wafer-level thermo-bonding adhesive film 231 is sucked by a die attach machine and is affixed to a substrate 260 such as a printed circuit board or ceramic circuit substrate. The die 213 can be quickly attached to a substrate at the thermal bonding temperature around 120° C.-175° C. even in few seconds. The adhesive strength between substrate 260 and die 213 is provided by means of the wafer-level thermo-bonding adhesive film 231 at the thermal bonding temperature. Also, a BGA package can be fabricated after executing the steps of forming bonding-wire 262, the molding package body 263 and the solder balls 261 (as shown in FIG. 4F).

Figure 5:
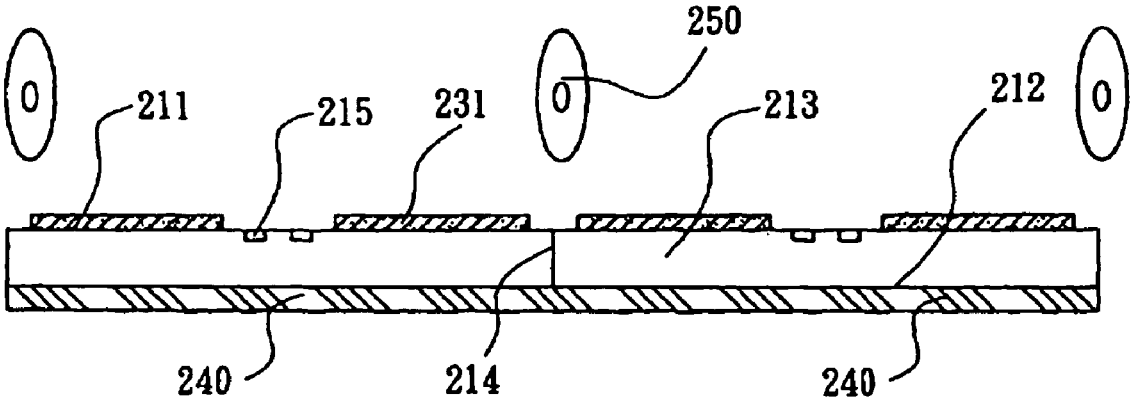
FIG. 5 is a cross-sectional view illustrating the inactive surface of wafer attached to a position tape for singulation to make adhesive dies in accordance with a third embodiment of the present invention.
Figure 6:
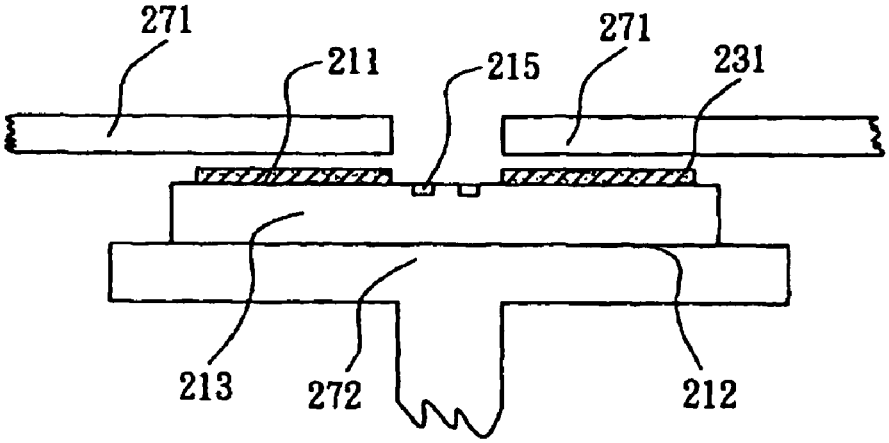
FIG. 6 and FIG. 7 are cross-sectional views illustrating an adhesive die made from the third embodiment in die-to-lead-frame package.
Figure 7:
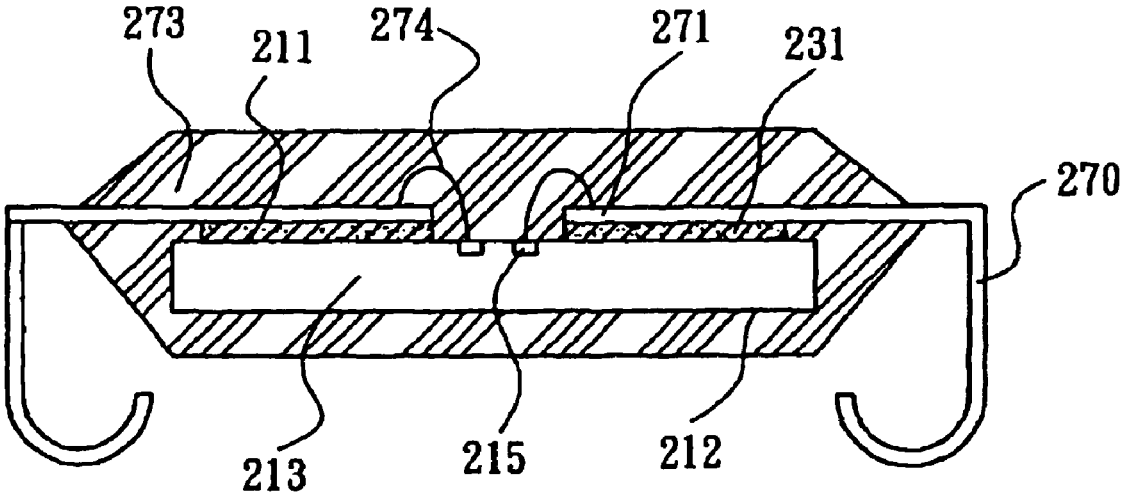

Moreover, in the third embodiment of the present invention, the process steps are the same as those illustrated in the second embodiment shown in FIG. 4A to FIG. 4C. As shown in FIG. 5, the inactive surface 212 of the wafer 210 is directly positioned to a position tape 240. After pre-curing the wafer 210, the active surface 211 of the wafer 210 faces upward and is singulated to form a plurality of die 213 by dicer 250. As shown in FIG. 6, the dies 213 with wafer-level thermo-bonding adhesive film 231 are sucked on a carrier 272, then the inner leads 271 of a LOC (Lead-On-Chip) lead frame are attached downward to the active surface 211 of the die 213. By thermal bonding the wafer-level thermo-bonding adhesive film 231 becomes adhesive to adhere the die 213 and the inner leads 271 of leadframe. As shown in FIG. 7, bonding wires 274, molding compound 273 are formed to manufacture a package of TSOP (Thin Small Outline Package) or QFP (Quad Flat Package). Therefore, according to the wafer treating method for making adhesive dies of the present invention, the dies 213 with wafer-level thermo-bonding adhesive film 231 can be massively manufactured at low cost for die-to-leadframe package.

The above description of embodiments of this invention is intended to be illustrative and not limiting. Other embodiments of this invention will be obvious to those skilled in the art in view of the above disclosure.

What is claimed is:

1. A wafer treating method for making adhesive dies comprising the steps of:

providing a wafer having a surface;

coating a liquid adhesive with two-stage property on the surface of the wafer, *wherein the surface of the wafer is partially coated with the liquid adhesive*;

pre-curing the liquid adhesive so that the liquid adhesive transforms into a wafer-level thermo-bonding adhesive film having B-stage property;

providing a positioning tape in contact with the wafer-level thermo-bonding adhesive film for positioning the wafer; and singulating the wafer on the positioning tape so as to form a plurality of dies with the wafer-level thermo-bonding adhesive film.

2. The wafer treating method for making adhesive dies in accordance with claim 1, wherein the liquid adhesive is formed by screen printing, stencil printing or spin coating.

3. The wafer treating methods for making adhesive dies in accordance with claim 1, wherein the surface of the wafer is an active surface of the wafer.

4. The wafer treating method for making adhesive dies in accordance with claim 1, wherein the surface of the wafer is an inactive surface of the wafer.

[5. The wafer treating method for making adhesive dies in accordance with claim 1, wherein the surface of the wafer is partially coated with the liquid adhesive.]

6. The wafer treating method for making adhesive dies in accordance with claim [5] *1*, wherein the wafer has cutting paths and bonding pads and wherein the surface is coated with the liquid adhesive without covering the cutting path and the bonding pads of the wafer.

[7. The wafer treating method for making adhesive dies in accordance with claim 1, wherein the entire surface of the wafer is coated with liquid adhesive.]

8. The wafer treating method for making adhesive dies in accordance with claim 1, wherein the wafer-level thermo-bonding adhesive film has a glass transition temperature (Tg) not less than 40° C.

9. The wafer treating method for making adhesive *dies in accordance with claim 1, wherein the wafer-level thermo-bonding adhesive* film has a thickness between 3~8 mil for die-to-die stacking.

10. The wafer treating method for making adhesive dies in accordance with claim 1, wherein the wafer-level thermo-bonding adhesive film has a thickness between 5~6 mil for die-to-die stacking.

11. The wafer treating method for making adhesive dies in accordance with claim 1, wherein the wafer-level thermo-bonding adhesive film has a thickness between 1~3 mil for die-to-substrate or die-to-leadframe attaching.

12. A wafer treating method for making adhesive dies comprising the steps of:

providing a wafer having an active surface upwardly, wherein a plurality of bonding pads are formed on the active surface, there are a plurality of cutting paths at the wafer to define dies;

coating a liquid adhesive on the partially active surface of the wafer, wherein the liquid adhesive exposes the bonding pads;

pre-curing the liquid adhesive so that the liquid adhesive transforms into a wafer-level thermo-bonding adhesive film having B-stage property; and singulating the wafer along the cutting path so as to form a plurality of dies with the wafer-level thermo-bonding adhesive film.

13. The wafer treating method for making adhesive dies in accordance with claim 12, wherein the liquid adhesive is formed by screen printing or stencil printing method.

14. The wafer treating method for making adhesive dies accordance with claim 12, wherein the wafer-level thermo-bonding adhesive film has a glass transition temperature (Tg) not less than 40° C.

15. The wafer treating method for making adhesive dies in accordance with claim 12, wherein the wafer-level thermo-bonding adhesive film has a thickness between 1~3 mil for die-to-leadframe attaching.

16. The wafer treating method for making adhesive dies in accordance with claim 12, wherein the coating step of a liquid adhesive, the liquid adhesive exposes the cutting paths.

* * * * *